United States Patent
Coneski et al.

(10) Patent No.: US 8,106,331 B2
(45) Date of Patent: Jan. 31, 2012

(54) APPARATUS FOR CONTROLLING ALIGNMENT BETWEEN PRECISION GROUND PLATES AND METHOD OF CONTROLLING A DESIRED ALIGNMENT BETWEEN OPPOSING PRECISION GROUND PLATES

(75) Inventors: Anthony F. Coneski, Newburgh, NY (US); Michael J. Domitrovits, New Paltz, NY (US); David C. Long, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 1092 days.

(21) Appl. No.: 11/866,470

(22) Filed: Oct. 3, 2007

(65) Prior Publication Data

US 2009/0090229 A1    Apr. 9, 2009

(51) Int. Cl.
B26F 1/14 (2006.01)
H05B 3/22 (2006.01)
H05B 3/30 (2006.01)

(52) U.S. Cl. ............. 219/201; 219/221; 83/687; 83/691

(58) Field of Classification Search .................. None
See application file for complete search history.

(56) References Cited

U.S. PATENT DOCUMENTS

| | | | | |
|---|---|---|---|---|
| 3,477,317 A * | 11/1969 | Liander | .......................... | 76/107.1 |
| 3,797,342 A * | 3/1974 | Sekel | ................................ | 83/55 |
| 4,239,471 A | 12/1980 | Swaroop | | |
| 4,391,034 A * | 7/1983 | Stuby | ............................. | 118/504 |
| 5,253,559 A * | 10/1993 | Philippe et al. | ................. | 83/133 |
| 5,303,618 A * | 4/1994 | Norell | ........................... | 76/107.1 |
| 5,783,026 A * | 7/1998 | Natarajan et al. | ............. | 156/378 |
| 6,119,555 A * | 9/2000 | DiMaria | ....................... | 76/107.1 |
| 6,463,831 B1 * | 10/2002 | DiMaria | ....................... | 76/107.1 |
| 6,507,006 B1 | 1/2003 | Hiramatsu et al. | | |
| 6,622,603 B1 * | 9/2003 | DiMaria | ......................... | 83/452 |
| 6,706,236 B2 * | 3/2004 | Zaremba et al. | ............... | 264/504 |
| 6,880,441 B1 * | 4/2005 | DiMaria | ......................... | 83/146 |
| 6,964,812 B2 | 11/2005 | Ito et al. | | |
| 7,510,619 B2 * | 3/2009 | LaPlante et al. | .............. | 156/261 |
| 2002/0031642 A1 * | 3/2002 | Ritland et al. | ................ | 428/117 |
| 2004/0222211 A1 | 11/2004 | Hiramatsu et al. | | |
| 2004/0242400 A1 | 12/2004 | Ito et al. | | |
| 2006/0289447 A1 | 12/2006 | Mohamed | | |
| 2008/0282864 A1 * | 11/2008 | Horn et al. | ....................... | 83/549 |

OTHER PUBLICATIONS

JP Publication No. 07-052094; Publication Date: Feb. 28, 1995. "Circuit Board Drilling Device". Patent Abstracts of Japan. 7 pages.

* cited by examiner

Primary Examiner — Joseph M Pelham
(74) Attorney, Agent, or Firm — Cantor Colburn LLP; Steven Bennett

(57) ABSTRACT

An apparatus for maintaining alignment between precision ground plates includes a first plate including a main body portion having plurality of passages. The first plate also includes a first heating device mounted to heat the main body portion to a selected temperature. A second plate including a main body portion having a plurality of passages is positioned adjacent the first plate. The second plate includes a second heating device mounted to heat the main body portion to a selected temperature. A controller operatively connected to the first and second heating devices selectively establishes a desired temperature in each of the first and second plates to facilitate a desired alignment between the plurality of passages in the first plate and the plurality of passages in the second plate.

16 Claims, 3 Drawing Sheets

APPARATUS FOR CONTROLLING ALIGNMENT BETWEEN PRECISION GROUND PLATES AND METHOD OF CONTROLLING A DESIRED ALIGNMENT BETWEEN OPPOSING PRECISION GROUND PLATES

BACKGROUND OF THE INVENTION

1. Field of the Invention

This invention relates to the art of manufacturing and, more particularly, to a method and apparatus for controlling alignment of precision ground plates employed in a manufacturing process.

2. Description of Background

Most ceramic chip carriers employ green sheets that are combined into multiple layers to form a component substrate. In order to facilitate connections to conducting layers positioned between the multiple layers of green sheets, each layer or green sheet is punched with multiple holes or vias. Often times a green sheet will included upwards of 200,000 holes. In order to form the holes, the green sheet is positioned in a punch die tool. The punch die tool employs precision ground plates that align a punch and a die to form the hole. Conventional punch die tools employ upwards of 250 solenoid controlled punches that operate at 20 Hz, i.e., are activated 20 times a second, to form holes in the green sheet. The holes formed in the green sheet are typically between approximately 2.5 and 6 mils in diameter. Thus, alignment between the precision ground plates is critical to accurate hole placement. Even small temperature deviations between upper and lower plates can result in misaligned hole placement.

Conventionally, the precision ground plates are fabricated in a controlled environment of approximately 68° F. (20° C.). Equipment for measuring the plates is also kept in the same controlled environment. However, the equipment or tools used to form the holes in the plates, e.g., die punches etc., are not utilized in the same controlled environment. Punch tools usually operate in an ambient environment of about 72° F.-78° F. (22.22° C.-25.55° C.) while operating temperatures of the tools may range from about 72° F. to about 85° F. (22.22° C.-29.44° C.). Moreover, as the punches are controlled by individual solenoids, the operation of the tool results in a temperature variation between upper and lower plates. The variations in plate temperature result in improper hole placement. Variations in hole placement also result from a tool cooling down during a tool replacement cycle. When the variation in hole placement exceeds a limit value, the punch contacts or clips the die plate. At this point, the punch die tool must go off line, and the upper and lower plates are re-ground back to tolerance. This is a costly process, not only due to the cost associated with the actual repair, but with the punch die tool offline, production output drops for as long as the machine is offline.

SUMMARY OF THE INVENTION

The shortcomings of the prior art are overcome and additional advantages are provided through the provision of an apparatus for maintaining alignment between precision ground plates. The apparatus includes a first plate including a main body portion having a first surface, an opposing second surface, and a plurality of passages that extend between the first and second opposing surfaces. The first plate also includes a first heating device mounted to heat the main body portion to a selected temperature. The apparatus further includes a second plate including a main body portion having a first surface, an opposing second surface, and a plurality of passages that extend between the first and second opposing surfaces. The second plate also includes a second heating device mounted to heat the main body portion to a selected temperature. Finally, the apparatus includes a controller that is operatively connected to the first and second heating devices. The controller is selectively operable to establish a desired temperature in each of the first and second plates to facilitate a desired alignment between the plurality of passages in the first plate and the plurality of passages in the second plate.

In accordance with another aspect of the present invention, a method of maintaining a desired alignment between opposing precision ground plates includes selectively heating a first precision ground plate to a desired temperature. The first precision ground plate includes a main body portion having a first surface, an opposing second surface, and a plurality of passages that extend between the first and second surfaces. The method further includes selectively heating a second precision ground plate to the desired temperature. The second precision ground plate is positioned adjacent the first precision ground plate and includes a main body portion having a first surface, an opposing second surface, and a plurality of passages that extend between the first and second surfaces. Finally, the method includes repeatedly passing a plurality of punches through corresponding ones of the passages in the first precision ground plate into respective ones of the passages in the second precision ground plate with the desired temperature of the first and second plates maintaining alignment between the plurality of passages in the first plate the plurality of passages in the second plate.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings wherein like referenced numerals represent corresponding parts in the several views.

DETAILED DESCRIPTION OF THE INVENTION

Figure 1:
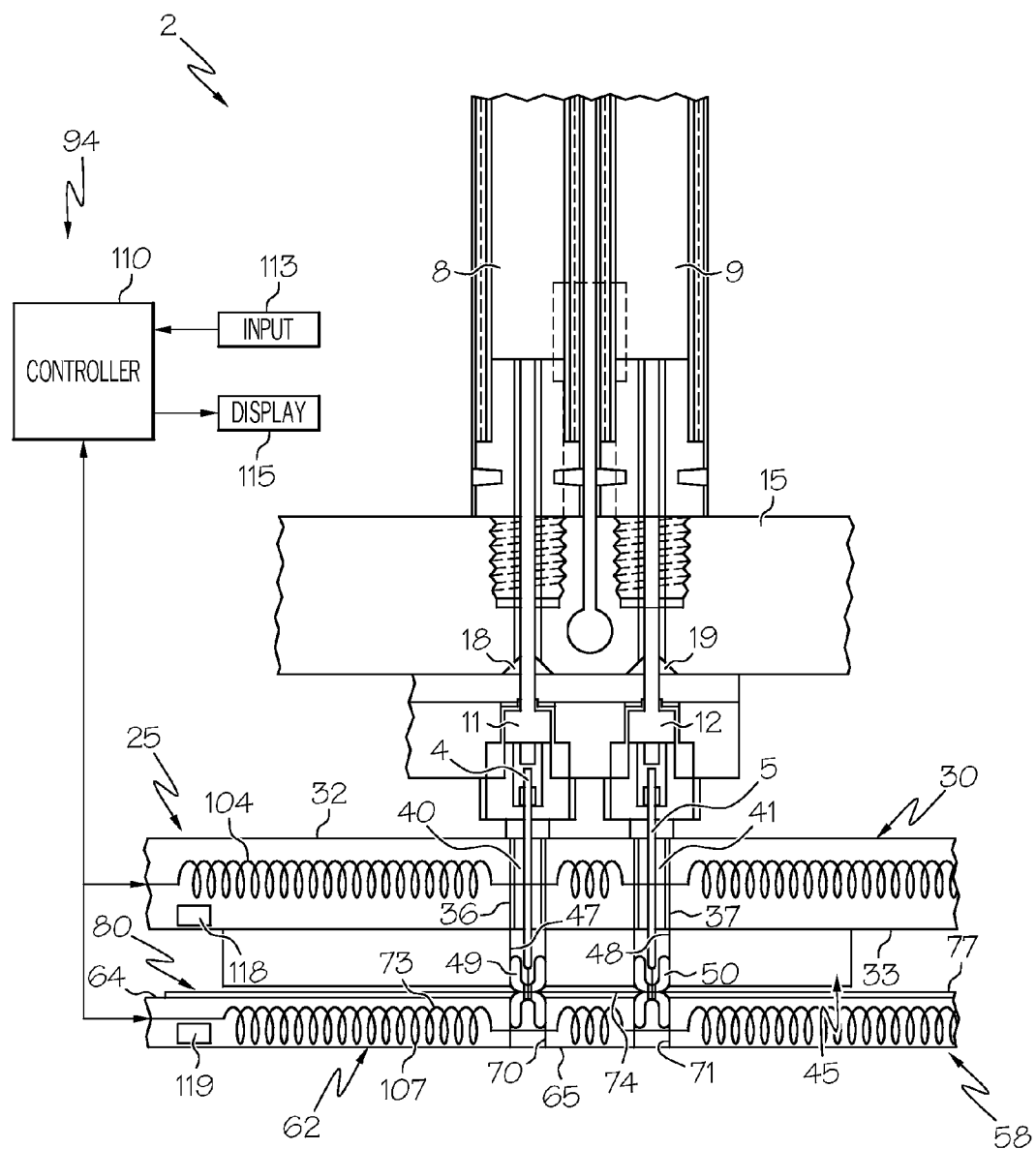
FIG. 1 illustrates an apparatus, shown on the form of a punch die tool, including a system for maintaining alignment between precision ground plates constructed in accordance with an exemplary embodiment of the present invention.

Turning now to the drawings in greater detail, it will be seen that in FIG. 1 there is a punch die tool 2 including a plurality of punches, two of which are indicated at 4 and 5. Punches 4 and 5 are operatively connected to corresponding solenoids 8 and 9 via actuating arms 11 and 12. More specifically, the solenoids 8 and 9 are mounted to a solenoid plate 15 with actuating arms 11 and 12 extending through passages 18 and 19 formed therein. At this point it should be understood that punch die tool 2 can include upwards of 250 or more punches and associated solenoids. In any event, solenoid plate 15 is positioned adjacent to a first precision ground or punch plate 25 having a main body 30 including a first surface 32 and an opposing second surface 33. Punch plate 25 includes a plurality of openings or passages, two of which are indicated at 36 and 37 that extend through main body 30 between first and second surfaces 32 and 33. Passages 36 and 37 align with passages 18 and 19 in solenoid plate 15.

In the embodiment shown, passages 36 and 37 include associated bushings/guides 40 and 41 that provide a preferred alignment for punches 4 and 5. Punch plate 25 also includes a stripper plate 45 having a plurality of passages, two of which are indicated at 47 and 48 provided with associated guides 49 and 50. Passages 47 and 48 align with passages 36 and 37 in punch plate 25 such that stripper plate 45 provides additional alignment for punches 4 and 5. That is, solenoids 8 and 9 are repeatedly operated to extend and retract punches 4 and 5 through passages 36, 37 and 47, 48 and into a second precision ground or die plate 58.

Towards that end, die plate 58 includes a main body 62 having a first surface 64 and an opposing second surface 65. Die plate 58 further includes a plurality of passages, two of which are indicated at 70 and 71, that extend through main body 62 between first and second surfaces 64 and 65. Passages 70 and 71 align with passages 36 and 37 in punch plate 25 and passages 47 and 48 and in stripper plate 45. In a manner similar to that described above, passages and 70 and 71 include associated bushings 73 and 74 that provide receptacles for receiving punches 4 and 5.

In the embodiment shown, punch die tool 2 is configured to form a plurality of passages in a green sheet 77 positioned between punch plate 25 and die plate 58. Green sheet 77 is one of multiple layers employed in constructing a substrate for an integrated circuit or IC chip. That is, up to 100 green sheets are laminated together with various intermediate conducting surfaces and grounding services to form a substrate for receiving an IC chip. Towards that end, each green sheet 77 is formed with as many as 200,000 or more holes or vias, that provide passage to one or more of the conducting and grounding surfaces layers. Each green sheet 77 is generally between approximately 8 thousandths of an inch or mils (0.2032 mm) and 12 thousandths of an inch or mils (0.013048 mm) in thickness with each of the vias being between about 2.5-6 mils (0.0635 mm-0.1524 mm) in diameter. In order to form all the required vias in a short time period, punch tool 2 is operated at approximately 20 Hz, such that each of the plurality of punches 4 and 5 passes through punch plate 25 into die plate 58 twenty times per second.

Operation of the plurality of solenoids 8 and 9 generates heat which is transferred from solenoid plate 15 into punch plate 25. That is, when up to 250 solenoids are repeatedly driving punched through green sheet 77, heat is generated that conducts though solenoid plate 15, into punch plate 25 and stripper plate 45. The application of heat causes a punch plate 25 and stripper plate 45 to expand relative to die plate 58. Small expansions in punch plate 25 result in a misalignment between passages 36, 37 and 47, 48 in punch plate 25 and stripped plate 45 relative to passages 70 and 71 in die plate 58. More specifically, under normal operation, punches 4 and 5 are provided with minimal clearance, e.g., 10 mils relative to passages 70 and 71. Therefore, even small misalignments between punch plate 25 and die plate 58 can cause a punches 4 and 5 to clip side portions (and not separately labeled) of passages and 70 and 71. Any contact between punches 4 and 5 and die plate 58 can result in damage, either to punches 4 and 5 or die plate 58. When damage occurs punch die tool 2 must be removed from operation and serviced. During service, the punches are replaces and the precision ground plates re-ground back to tolerance. This process requires considerable machine downtime, which results in loss of production. In order to mitigate alignment problems, punch die tool 2 includes a thermal control system 94 that ensures a desired alignment and physical location between punch plate 25 and die plate 58 based on a calculated optimal operating temperature for a particular green sheet. That is, each green sheet is configured for a particular substrate layer. Depending upon which substrate layer the green sheet is being fabricated for; thermal control system 94 establishes a desired alignment between punch plate 25 and die plate 58 to ensure that vias are formed at nominal locations.

In accordance with the exemplary embodiment shown, thermal control system 94 includes a first heating element 104 positioned to heat punch plate 25 and a second heating element 107 positioned to heat die plate 58. Heating element 104 is embedded in punch plate 25 between first and second surfaces 32 and 33. Likewise, heating element 107 is embedded in die plate 58 between surfaces 64 and 65. Heating elements 104 and 107 are operatively connected to a controller 110 having an input portion 113 for establishing a desired temperature in each of punch plate 25 and die plate 58 and a display at 115 for monitoring the desired temperature in punch plate 25 and die plate 58. Towards that end, punch plate 28 and die plate 58 includes corresponding temperature sensors 118 and 119 that are operatively connected to controller 110.

Controller 110 can be any appropriate high-powered solid-state switching device. As illustrated, controller 110 is represented as a computer. However, this is merely exemplary of an appropriate high-powered controller, which is within the scope of the invention. It will be appreciated by those skilled in the art that controller 110 can also be implemented using a variety of separate dedicated or programmable integrated or other electronic circuits or devices, such as hardwired electronic or logic circuits including discrete element circuits or programmable logic devices, such as PLDs, PALs, PLAs or the like. Controller 110 can also be implemented using a suitably programmed general-purpose computer, such as a microprocessor or microcontrol, or other processor device, such as a CPU or MPU, either alone or in conjunction with one or more peripheral data and signal processing devices. In general, any device or similar devices on which a finite state machine can be used as the control.

In accordance with one aspect of the present invention, controller 110 establishes a temperature for each of punch plate 25 and die plate 58 that ensures proper alignment between passages 36 and 37 and passages 70 and 71 despite heat generated by the operation of the plurality of solenoids 8 and 9. In this manner, punch die tool 2 is operated to repeatedly form passages in green sheet 77 without any undesired misalignment between passages 36, 37 and 47, 48 in punch plate 25 and stripper plate 45 and passages 70, 71 in die plate 58.

Figure 2:
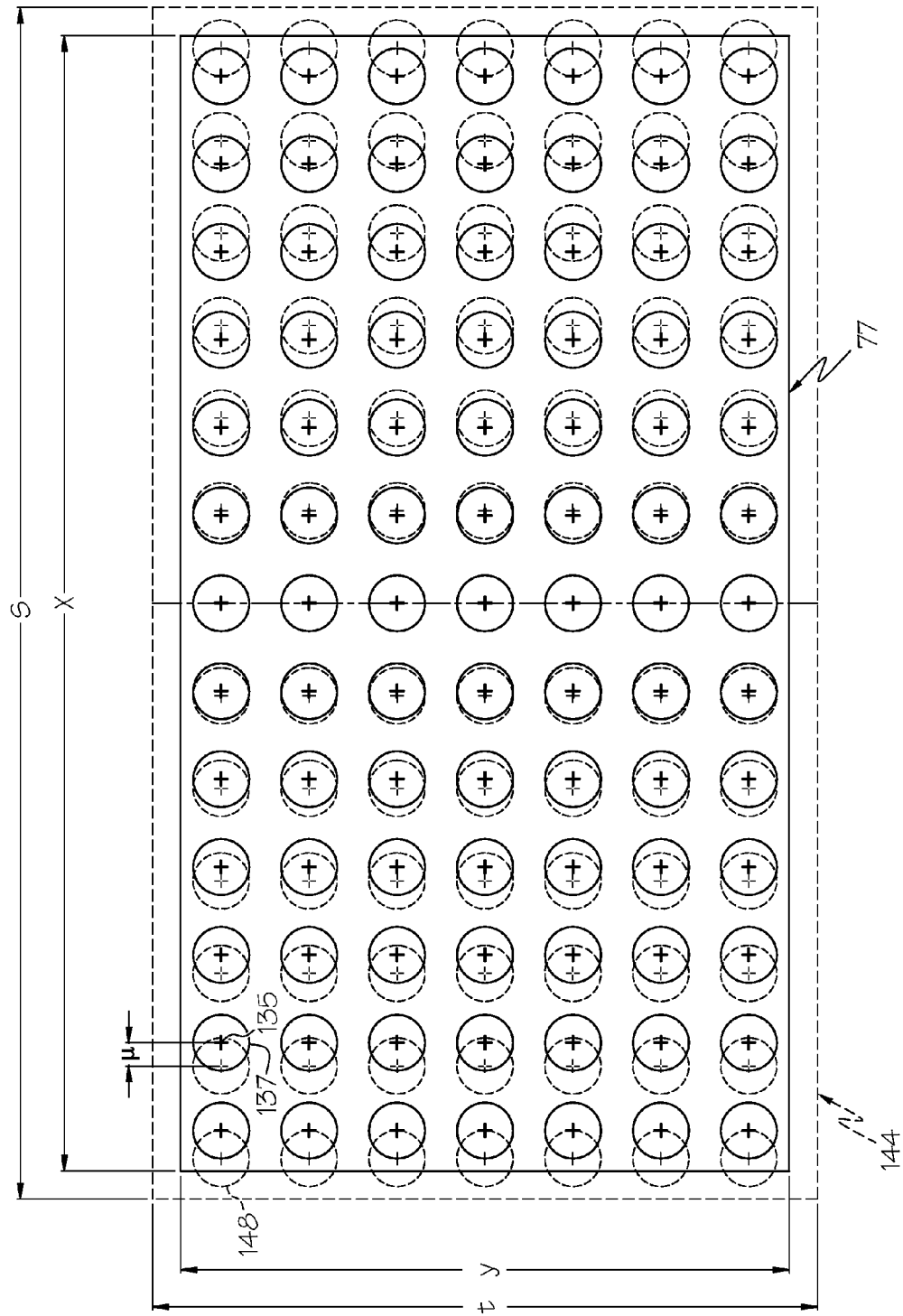
FIG. 2 illustrates a green sheet prior to being punched by the punch die tool of FIG. 1.
Figure 3:
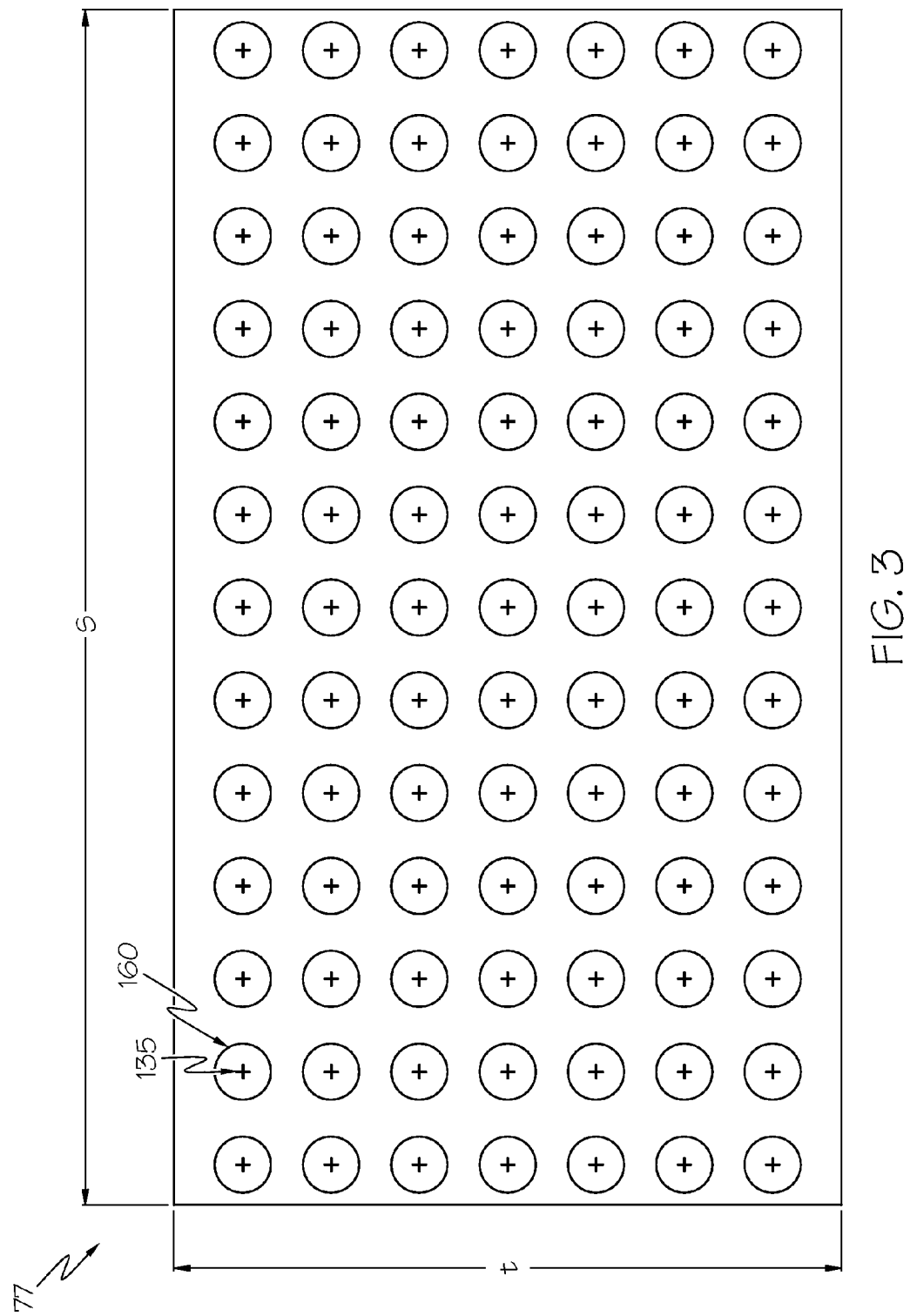
FIG. 3 illustrates the green sheet of FIG. 2 after being punched by the punch die tool.

In accordance with another aspect of the present invention, controller 110 establishes a controlled alignment between punch plate 25 and die plate 58. More specifically, green sheet 77 originally includes a length "x" and a width "y" that establishes a first surface area. After repeated punching, green plate 77 expands to a second length "s" and a second width "t" creating a second surface area. Thus, when punch die tool 2 is configured to form holes in sheet 77 based on the first surface area, holes are actually formed at a position off-set from a desired hole location. That is, (green sheet 77 includes a plurality of nominal target points, one of which is indicated at 135, for establishing a corresponding plurality of holes or vias, such as indicated at 137. Repeated punching has been found to actually enlarge the first surface area causing a shift in desired hole location relative to the plurality of nominal target points. Towards that end, controller 110 is configurable to establish a controlled alignment between punch plate 25 and die plate 58 by selectively operating heating element 104 and heating element 107 to establish a temperature in punch plate 25 and die plate 58 that is either higher or lower than a temperature required to maintain alignment for the plurality of nominal target points. As shown in FIG. 2, controller 110 establishes an offset value "μ" from each of the plurality of target points. In essence, controller 110 creates a virtual green sheet 144 having a plurality of virtual target points, such as indicated at 148 off-set from the plurality of target points 135 on green sheet 77. In this manner, following processing, green sheet 77 now has a length "s" and a width "t" having a plurality of vias, such as indicated at 160 in FIG. 3, being at the desired one of the plurality of target points 135.

At this point it should be understood that the exemplary embodiments described above ensure proper alignment between precision ground plates provide proper alignment for tools passing between the precision ground plates. In this manner, the tools do not come in contact with the precision ground plates during operation. In addition, an exemplary embodiment of the present invention provides a controlled alignment with offset between precision ground plates. That is, the controlled alignment establishes an offset for creating vias in an intermediate, e.g., green sheet at preferred locations to account for any growth in the intermediate sheet resulting from repeated punching.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

The invention claimed is:

1. An apparatus for controlling alignment between precision ground plates, the apparatus comprising:
    a first plate including a main body portion having a first surface, an opposing second surface, and a plurality of passages that extend between the first and second opposing surfaces, the first plate including a first heating device mounted to heat the main body portion to a selected temperature;
    a second plate including a main body portion having a first surface, an opposing second surface, and a plurality of passages that extend between the first and second opposing surfaces, the second plate including a second heating device mounted to heat the main body portion to a selected temperature; and
    a controller operatively connected to the first and second heating devices, the controller being programmed to selectively control each of the first and second heating devices to establish the selected temperature in each of the first and second plates to achieve a desired alignment between the plurality of passages in the first plate and the plurality of passages in the second plate.

2. The apparatus according to claim 1, wherein each of the first and second heating devices is an electrically resistive heating device.

3. The apparatus according to claim 1, wherein each of the first and second heating devices is embedded into a corresponding one of the first and second plates.

4. The apparatus according to claim 1, further comprising:
    a plurality of solenoids mounted adjacent the first plate; and
    a plurality of punches operatively connected to respective ones of the plurality of solenoids, the plurality of solenoids being selectively operated to drive the plurality of punches through the plurality of passages in the first plat and into the plurality of passages in the second plate.

5. The apparatus according to claim 4, wherein the first plate is a punch plate.

6. The apparatus according to claim 5, wherein the punch plate includes a stripper plate including a plurality of passages that align with the plurality of passages in the punch plate, the stripper plate being secured to the second surface of the punch plate.

7. The apparatus according to claim 5, wherein the second plate is a die plate.

8. The apparatus according to claim 1, further comprising:
    a first sensor mounted to the first plate, the first sensor being operatively connected to the controller; and
    a second sensor mounted to the second plate, the second sensor being operatively connected to the controller, each of the first and second sensors detecting a temperature of respective ones of the first and second plates.

9. The apparatus according to claim 8, wherein each of the first and second sensors is embedded in a corresponding one of the first and second plates.

10. The apparatus according to claim 1, wherein the selected temperature in the first plate is the same as the selected temperature in the second plate.

11. A method of controlling a desired alignment between opposing precision ground plates, the method comprising:
    selectively heating a first precision ground plate to a desired temperature, the first precision ground plate including a main body portion having a first surface, an opposing second surface, and a plurality of passages that extend between the first and second surfaces;
    selectively heating a second precision ground plate to a selected temperature, the second precision ground plate being positioned adjacent the first precision ground plate and including a main body portion having a first surface, an opposing second surface, and a plurality of passages that extend between the first and second surfaces; and
    repeatedly passing a plurality of punches through corresponding ones of the passages in the first precision ground plate into respective ones of the passages in the second precision ground plate with the desired temperature of the first plate and the selected temperature of the second plate maintaining alignment between the plurality of passages in the first plate and the plurality of passages in the second plate.

12. The method of claim 11, further comprising:
    placing a sheet between the first and second precision ground plates, the sheet having a plurality of predetermined target points for hole placement;
    operating a plurality of punches positioned adjacent the first precision ground plate, the plurality of punches passing through the plurality of passages in the first precision ground plate into the passages in the second ground plate through the target points in the sheet; and
    controlling the first temperature of each of the first and second precision ground plates such that operating temperatures of the plurality of punches do not offset the plurality of passages in the first and second precision ground plates relative to the passages in the second precision ground sheet and the target points on the sheet.

13. The method of claim 12, further comprising:

mounting the sheet on a floating stage; and selectively moving the floating stage between the first and second precision ground plates to align additional ones of the plurality of predetermined target points for hole placement with the plurality of passages in the first precision ground sheet and the plurality of passages in the second precision ground sheet.

14. The method of claim 11, further comprising:

placing a sheet having a first surface area between the first and second precision ground plates, the sheet having a plurality of predetermined target points for hole placement;

determining an offset of the first and second precision ground plates, the offset establishing a controlled alignment of the passages in at least one of the first and second precision ground plates relative to the predetermined target points;

selectively heating the first and second precision ground plates to a second temperature, the second temperate establishing the controlled alignment;

operating the plurality of punches to repeatedly form holes in the sheet, the holes enlarging the sheet to a second surface area, wherein the controlled alignment located the holes at the predetermined target points for hole placement.

15. The method of claim 14, further comprising:

mounting the sheet on a floating stage; and selectively moving the floating stage between the first and second precision ground plates.

16. The method of claim 11, further comprising: passing the punches through a green sheet.

* * * * *